United States Patent [19]

Pattany et al.

[11] Patent Number: 5,051,697
[45] Date of Patent: Sep. 24, 1991

[54] FLOW ANGIOLOGY WITH STATIC SIGNAL SUPPRESSION

[75] Inventors: Pradip M. Pattany; Keith Wong, both of Colorado Springs, Colo.

[73] Assignee: Tesla Imaging Corporation, Colorodo Springs, Colo.

[21] Appl. No.: 538,854

[22] Filed: Jun. 15, 1990

[51] Int. Cl.⁵ ............................................. G01R 33/20
[52] U.S. Cl. ...................................... 324/306; 324/309
[58] Field of Search ................................. 324/306, 309

[56] References Cited

U.S. PATENT DOCUMENTS 4,697,149 9/1987 Moran ................................... 324/309
4,777,956 10/1988 Macovski ....................... 128/653 AF
4,918,386 4/1990 Dumoulin et al. .................. 324/309

Primary Examiner—Michael J. Tokar
Assistant Examiner—William Francos
Attorney, Agent, or Firm—Beaton & Swanson

[57] ABSTRACT

A method for rephasing one or more of the motion components of moving material in a nuclear magnetic resonance imaging system, including velocity, acceleration, pulsatility and higher order motion components. Gradient pulses are applied in one or more of the read, phase encode and slice select directions, and subsequent gradients are then applied in one or more of such directions so that the total net phase in such direction is zero for the desired motion component and non-zero for static material.

4 Claims, 4 Drawing Sheets

FLOW ANGIOLOGY WITH STATIC SIGNAL SUPPRESSION

BACKGROUND OF THE INVENTION

The present invention relates to nuclear magnetic resonance imaging, sometimes called NMR. It is particularly applicable to uses in imaging body tissue in the medical field, since NMR is non-invasive and does not employ ionizing radiation.

Briefly, any nucleus with a magnetic moment tends to align itself in the direction of a magnetic field. However, the nucleus precesses around the magnetic field direction at a characteristic angular frequency which depends on the magnetic field strength and a constant relating to the particular nucleus properties. The components of the precession in the plane perpendicular to the magnetic field are in a random order. However, by applying a second magnetic field in the plane perpendicular to the first magnetic field, the precession will align to produce a net magnetic moment in that perpendicular plane. When the magnetic field is discontinued, the decay of the magnetic moment causes the emission of a radio frequency signal in the form of an oscillating sine wave. This radio frequency signal is measurable. By manipulating the magnetic field directions and gradients, data can be assembled to enable the generation of volumetric projections. A background description of nuclear magnetic resonance imaging and various methods for manipulating the magnetic fields can be found in U.S. Pat. Nos. 4,697,149 by Moran and U.S. Pat. No. 4,777,956 by Macovski and the references mentioned therein, all of which are hereby incorporated by reference.

The magnetic fields can be applied in a gradient along an axis to produce a frequency phase shift in the gradient direction. A series of gradients can be applied along one or more axes. The application of these field gradients allows moving material to be identified and the artifacts of motion to be desensitized. This can be done for a zeroth, first, second, third, and through jth order of motion to achieve rephasing of material that is static, material that has a constant velocity in the direction of the gradient, material that has a constant acceleration in the direction of the gradient, material that has a constant pulsatility in the direction of the gradient, and through material that has a jth order of motion in the direction of the gradient, respectively.

This method is described in U.S. Pat. No. 4,728,890 by Pattany et al., which is hereby incorporated by reference. In the preferred embodiment of that patent, the operator can select a zeroth, first, second, or third order motion desensitization. To make a zeroth order desensitization, i.e. rephase static material, a gradient pulse is added in each of the read and slice select gradient directions. The static or zeroth order gradient pulses are appropriately scaled in duration and amplitude such that the sum of the zeroth moments in time of the gradient pulses along each of the read and slice select directions is zero.

When a first order correction is selected, another gradient pulse is added to the pulse sequence such that the sum of the first moments in time along each of the slice select and read gradient directions are zero. Under the method of that patent, the sum of both the zeroth and first moments are set to zero to correct for both static rephasing and constant velocity artifacts. When a second order desensitization is selected, an additional gradient pulse is added such that the sum of the second moments in time of the gradients along each of the read and slice select directions is also zero. In this manner, correction is made for static components, constant velocity components, and acceleration. To correct for pulsatility related artifacts, a third order correction or desensitization is selected. In a third order correction, yet another gradient pulse is added such that the sums of the zeroth, first, second and third moments are set equal to zero. Analogously, fourth and higher order corrections may be made in a similar manner.

This approach is effective in desensitizing motion artifacts. However, in imaging moving materials such as in angiogram images, the goal is to distinguish the moving material from the static material. To do this, the static material must be dephased, preferably by a predetermined amount, while the moving material is rephased. Rephasing the moving material presents particular difficulties because the motion characteristics vary; that is, the velocity, acceleration, pulsatility and higher order motion components may vary from element to element.

SUMMARY OF THE INVENTION

The present invention goes further than prior methods, in that desired motion components are completely rephased while static components are dephased. In this way, the present invention allows the acquisition of vascular angiograms or other volumetric projections of moving material without any interfering signal or only a predetermined interfering signal from static material. Moreover, the rephased moving material may be selected as material with any combination of constant velocity, constant acceleration, constant pulsatility or any other constant higher order motion component. This allows excellent imaging, especially of small vessels with slow flowing blood. Because the entire imaging is accomplished with a single gradient sequence, no cardiac gating is necessary, patient displacement errors are minimized, and as few as one RF signal per sequence may be utilized in order to minimize RF power use.

The present invention includes the application of at least a resonance excitation pulse, a slice select gradient pulse, and a read gradient pulse. One or more additional gradient pulses are applied which have components in at least one of the slice select and read gradient directions. The relative amplitudes and durations of the additional gradient pulses are selected such that the sum of a selected one or more of the first through third or higher order moments in time of the gradient pulses in the selected direction between the excitation pulse and the center of the read gradient pulse is zero. In this manner, a selected one or more of the constant velocity, acceleration, pulsatility and higher order components are rephased while the static component is left dephased.

DETAILED DESCRIPTION OF THE PREFERRED EMBODIMENT

Figure 1:
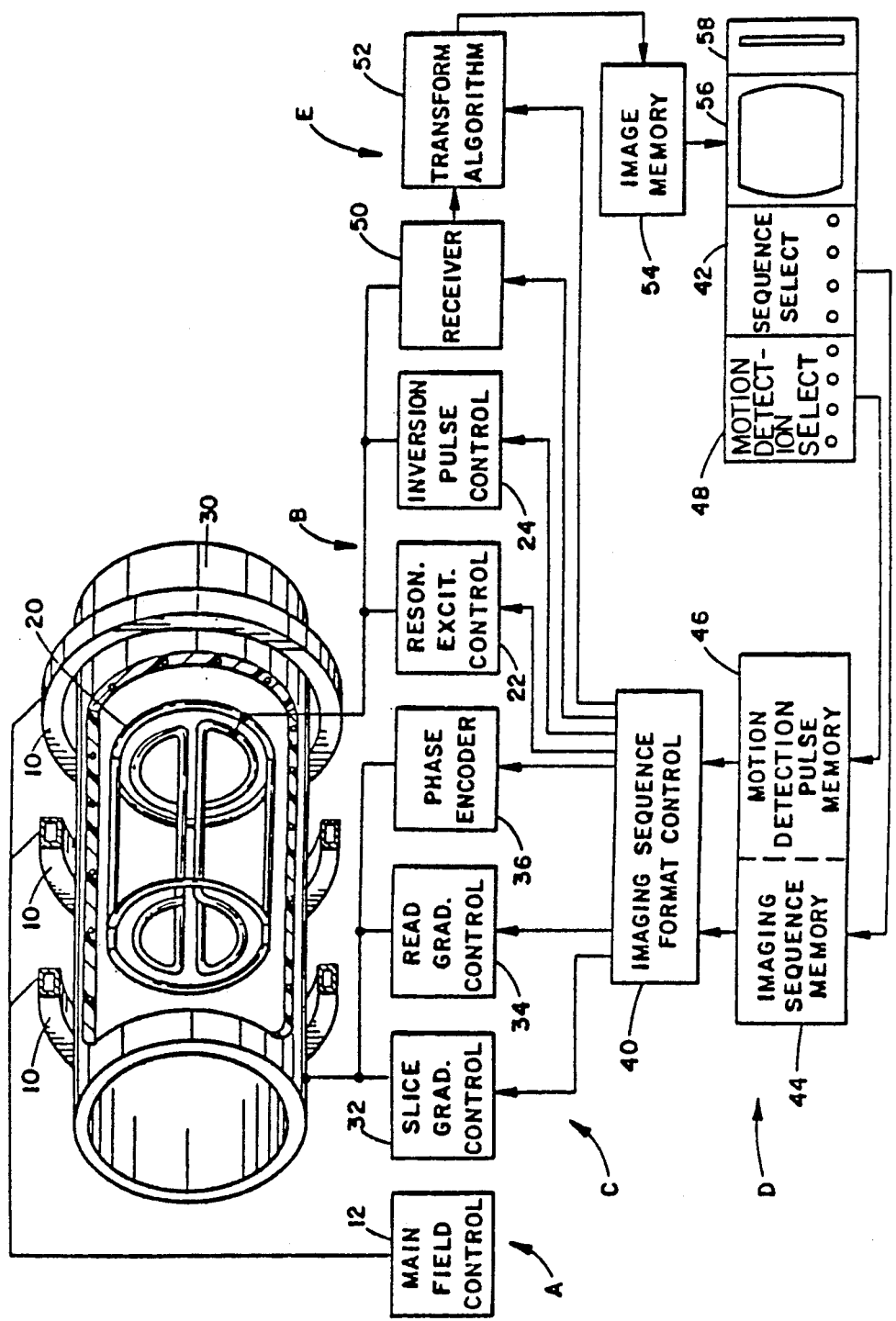
FIG. 1 is a diagrammatic representation of a magnetic resonance imaging apparatus in accordance with the present invention.

The invention utilizes standard nuclear magnetic resonance imaging hardware, as shown in FIG. 1. A magnetic resonance imaging apparatus includes a main magnetic field means A for generating a substantially uniform magnetic field linear through an image region. A radio frequency means B selectively transmits radio frequency excitation, inversion, and other pulses into the image region to excite and manipulate resonating dipoles therein. A gradient field means C selectively applies a gradient field preferably along three orthogonal axes, across the image region. A pulse sequence control means D controls the radio frequency and gradient means to cause the generation of preselected pulse sequences, such as the sequences illustrated in FIGS. 3 and 4. An image means E reconstructs received magnetic resonance signals into electronic image representations which may be displayed or stored.

The main magnetic field means A includes a plurality of magnets 10 and a control circuit 12 therefor. The control circuit causes the magnets to generate a uniform magnetic field axially therethrough, particularly in a centrally located image region.

The radio frequency means B includes a radio frequency RF coil 20, such as a quadrature coil which surrounds the image region. A resonance excitation control circuit 22 selectively applies radio frequency pulses to the RF coil 20 to excite magnetic resonance of dipoles in the image region. An inversion pulse control circuit or means 24 selectively applies inversion pulses, for selectively inverting or flipping the spin of the resonating nuclei. Optionally, pulses of other configurations for making other selected manipulations of the spins may be generated.

The gradient control means C includes a gradient coil arrangement 30 which includes the appropriate windings for causing gradients across the main magnetic field in the image region at selectable angles. In the preferred embodiment, gradients are selectively caused along three orthogonal axes designated as the slice select, read, and phase encode axes or directions. A first axis or slice selection gradient control means 32 selectively applies electrical power to the gradient coil assembly to select one or a multiplicity of slices or planes in the image region to be mapped, or a set of adjacent slices called a slab. Commonly the slice is selected by applying a linear field gradient across the image region and applying a narrow band excitation pulse to excite spins over a limited range of resonance frequencies. A second axis or read gradient control means 34 selectively applies a read gradient across the image region in the read direction. A third gradient or phase encode gradient control means 36 selectively applies phase encode gradients for spatially encoding the resonance signal.

The pulse sequence control means D includes a pulse sequence format means 40 which formats RF and gradient pulses in a selected sequence to be applied to the radio frequency and gradient coils. More specifically, a pulse sequence selection means 42 is controlled by the operator to select from a plurality of available pulse sequences, such as a spin-echo inversion recovery, multi-echo, gradient-echo, or other conventional imaging sequence. The sequence selection means further enables the operator to select some parameters of the sequence, such as duration, number of repetitions, and the like. An imaging pulse sequence memory means 44 is preprogrammed to store a description of each of the pulses which is applied during one of the selected sequences. Specifically, for a given sequence, the imaging pulse sequence memory stores the time and description of the RF pulse, the on and off times and amplitude of each of the slice select gradient pulses, the times and amplitudes of read gradient pulses, the times and amplitudes of phase encode gradient pulses, an indication of when generated resonance signals are to sampled, and the like.

The start and stop times and amplitude for motion detection gradient pulses to be applied in each of the read and slice select directions are preferably stored in the same memory as the imaged pulse sequences as an integral part thereof. However, for greater flexibility in selecting the motion detection, a motion detection pulse memory means 46 may be provided. A motion detection means 48 enables the operator to select whether or not a motion detection is to be made.

At the end of each applied pulse sequence, conventionally during a read gradient pulse, a radio frequency receiver 50 is gated to receive the magnetic resonance signal generated by the resonating nuclei. The receiver may be connected with the RF coil 20, as illustrated, or may be connected with a dedicated receive-only coil. A conventional image reconstruction means 52, such as an algorithm for performing a two dimensional or three dimensional Fourier transform, transforms the received signal into an image representation. The signal from each pulse sequence forms one view of the image which is stored in an image memory 54. Subsequent views from subsequent pulse sequences with different phase encode gradients are stored in the image memory to build the electronic image representation. A video monitor or other display means 56 converts the electronic image representation into a visual image. Optionally, the image representation may be stored in a storage means 58, such as a tape or disc.

The application of a gradient produces a phase shift along the gradient axis. The application of subsequent gradients along that axis can be used to rephase. The dephasing and rephasing is in accordance with the following:

$$\phi(t) = \int_0^T \gamma G(t)x(t)dt \quad (1)$$

Where $\phi(t)$ is the phase of the material at time t, $\gamma$ is the gyromagnetic ratio constant, G(t) is the gradient amplitude at time t, x(t) is the position of the material at time t, and T is the sampling total time.

The x(t) term can be expanded in a power series as:

$$x(t) = \sum_{j=0}^{\infty} \frac{t^{(j)} x^{(j)}}{j!} \quad (2)$$

Where x(i) is the jth differential of x at time zero. Each of the terms of the expanded x(t) terms in equation (2) can be integrated separately in equation (1) and brought equal to a zero value for those motion components which are to be rephased, by applying j gradients along the slice select axis. Mathematically, this is expressed as:

$$\phi_s = \int_0^T \gamma G(t) x \, dt \quad (3a)$$

$$\phi_v = \int_0^T \gamma G(t) \frac{dx}{dt} \frac{t}{1!} \, dt \quad (3b)$$

$$\phi_a = \int_0^T \gamma G(t) \frac{d^2x}{dt^2} \frac{t^2}{2!} \, dt \quad (3c)$$

$$\phi_j = \int_0^T \gamma G(t) \frac{d^jx}{dt^j} \frac{t^j}{j!} \, dt \quad (3d)$$

Where $\phi_s$ is the phase of static material, $\phi_v$ is the phase of material with a first moment (constant velocity), $\phi_a$ is the phase of material with a second moment (constant acceleration), and $\phi_j$ is the phase of material with a jth moment.

In order to completely rephase material with a jth moment, equation 3(d) is set equal to zero so that there is not net phase shift for that material. Any combination of Equations (3) can be solved simultaneously by setting the desired jth moment equal to a predetermined constant, in order to determine the amplitude and duration of motion gradients. As a practical matter, all the desired imaging of moving material may be achievable by rephasing only constant velocity material and constant acceleration material by setting equations 3(b) and 3(c) equal to zero. It is important to note that, regardless of the number of moments utilized, it is not necessary to completely rephase the static material. In fact, it is desirable not to completely rephase the static material, for such rephasing would defeat the purpose of distinguishing the static material from the moving material. Therefore, equation 3(a) is not set equal to zero.

Figure 2:
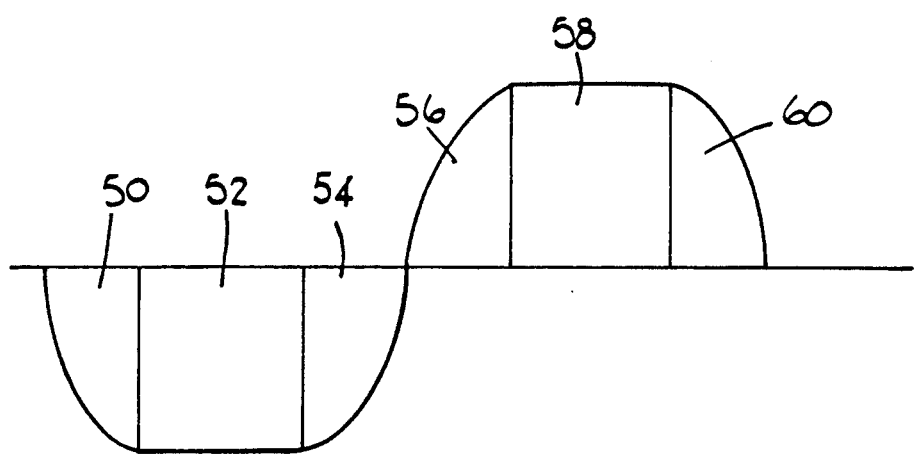
FIG. 2 shows a typical single gradient pulse.

In determining the integrals in the equations above, it is to be noted that the rise in amplitude of the fields over time does not occur instantaneously, but is generally a profile that can be divided into three components, as shown in FIG. 2. Components 50, 54, 56 and 60 are trigometric functions that can be expressed, respectively, as:

$$\int_a^b \gamma G(t) x(t) \sin\left(\frac{T-a}{a-b}\right)\frac{\pi}{2} \, dt \quad (4a)$$

$$\int_d^c \gamma G(t) x(t) \cos\left(\frac{T-c}{d-c}\right)\frac{\pi}{2} \, dt \quad (4b)$$

Components 52 and 58 are constants. Therefore, Equation (1) can be expressed as:

$$\phi(t) = \int_a^b \gamma G(t) x(t) \sin\left(\frac{T-a}{a-b}\right)\frac{\pi}{2} \, dt + \int_b^c \gamma G(t) x(t) \, dt + \int_d^c \gamma G(t) x(t) \cos\left(\frac{T-c}{d-c}\right)\frac{\pi}{2} \, dt \quad (5)$$

where the first integral is the integration of the increasing amplitude component of the amplitude versus time plot, the second integral is the integration of the constant amplitude component, and the third integral is the integration of the decreasing amplitude component of the amplitude versus time plot.

Figure 3:
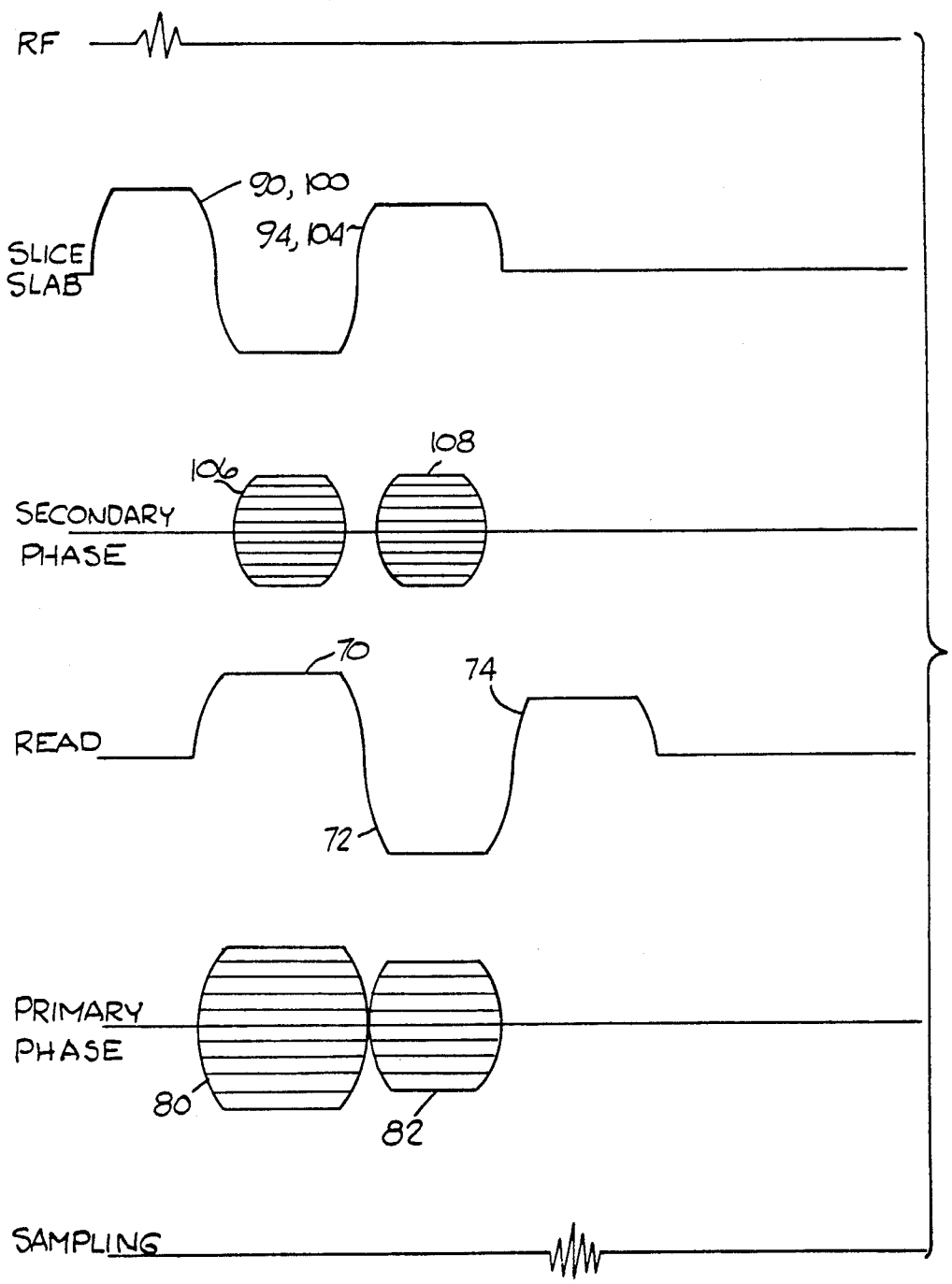
FIG. 3 shows a gradient pulse sequence with a first order motion detection for detecting constant velocity material.

FIG. 3 shows the application of the present invention to a two or three dimensional space for utilization with a two or three dimensional Fourier Transformation to detect material moving with a constant velocity. The beginning of a first order motion detection sequence is designated as time t(o). To rephase for static material and material moving with constant velocity in the read axis, three gradients 70, 72 and 74 are applied at given time intervals, as shown in FIG. 3. The amplitude of the read gradient 74 is known at the time of sampling.

Equations 3(a) and 3(b) are solved simultaneously by setting them equal to zero to give the amplitudes of gradients 70 and 72. This results in complete rephasing of the static material and material flowing with a constant velocity at the center of the data sampling period.

A pair of primary phase encode gradients 80 and 82 are applied as shown in FIG. 3, in a manner similar to the application of the read gradient. This primary phase encode gradient establishes the field of view and the total associated phase shift to spatially encode the static material. Equation 3(b) is then set equal to zero and the two equations are solved simultaneously to determine the amplitude of the motion gradients 80 and 82. This results in total rephasing of the constant velocity material, while leaving a predetermined phase shift of the static material for spatial encoding.

A slice select gradient is also applied, as shown in FIG. 3. The duration and amplitude of the gradient 90 applied during the RF signal is known. The amplitude of the subsequent gradients 92 and 94 are determined by setting Equation 3(a) to a predetermined non-zero value, setting Equation 3(b) to zero, and solving the two equations simultaneously. This will cause a desired dephasing of the static material, while completely rephasing the material moving with constant velocity in the slice select direction.

The invention is also applicable to a three dimensional space with a three dimensional Fourier Transformation. The read gradient and primary phase encode gradients are generated similarly as for the two dimensional case. However, the slice selection gradient is generated differently to account for the volume.

A volume is excited with a slab selection gradient 100 which is analogous to the slice selection gradient 90 applied in the two dimensional case. Also, gradients 102 and 104 are applied, again similarly to the two dimensional case, so that static material is dephased along the slab selection axis by a predetermined amount and constant velocity material is completely rephased.

A pair of secondary phase encode gradients 106 and 108 are generated similarly to the primary phase encode gradients to encode each slice within the slab. The use of both a slab selection gradient and a pair of secondary phase encode gradients allows each slice within the slab to be identified. The additive sum of the slab selection gradients and secondary phase encode gradients results in dephasing of the static material by a desired predetermined amount while completely rephasing the constant velocity material.

Figure 4:
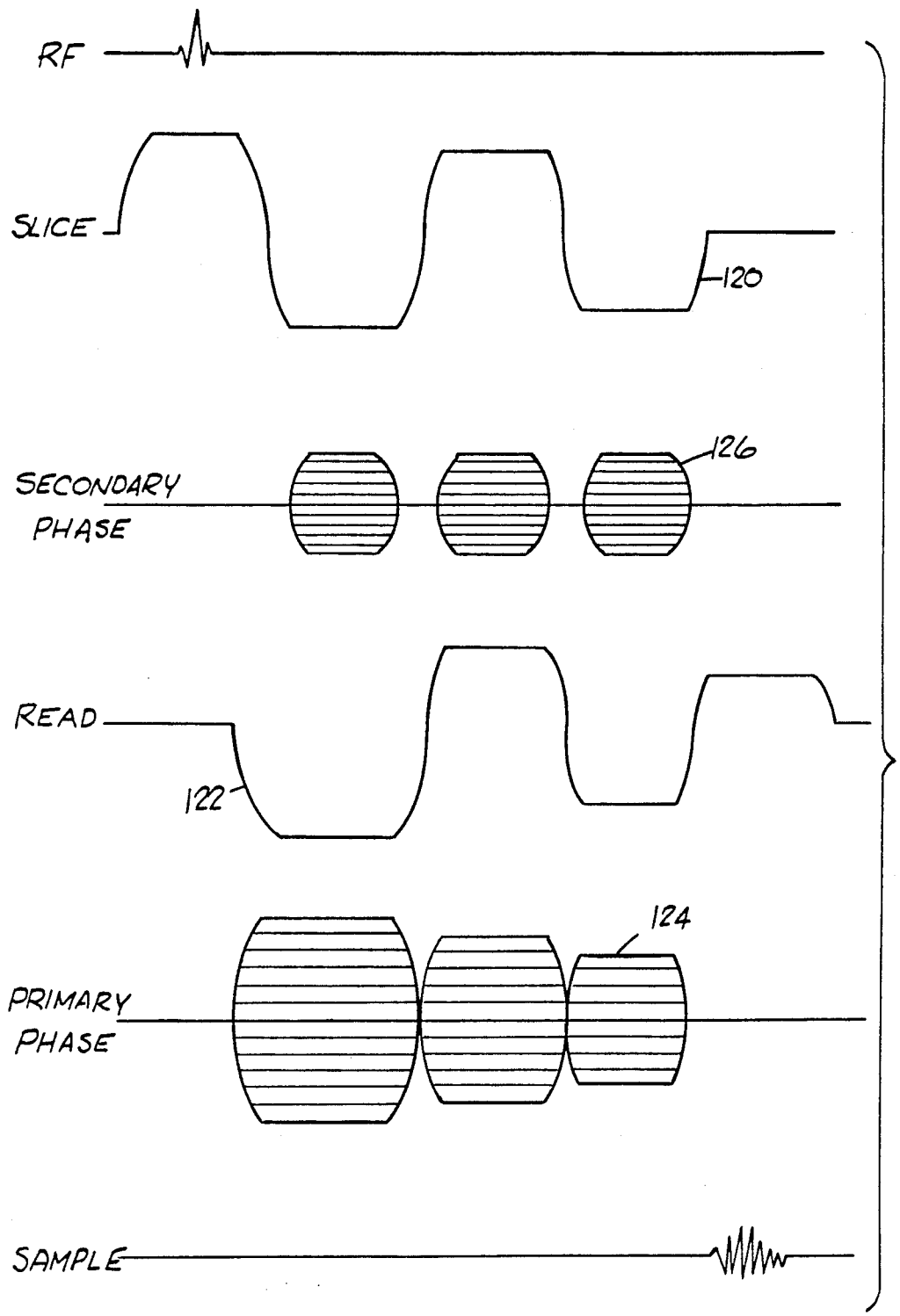
FIG. 4 shows a gradient pulse sequence with a second order motion detection for detecting constant acceleration material.

FIG. 4 shows the application of the present invention to a two or three dimensional space for utilization with a two or three dimensional Fourier Transformation to detect both material moving with a constant velocity and material moving with a constant acceleration. The process is quite similar to the process for detecting only material moving with a constant velocity, except that an additional gradient is applied along each axis. Thus, additional gradient 120 is applied along the slice axis to rephase material moving with a constant acceleration along that axis, additional gradient 122 is applied along the read axis to rephase material moving with a constant acceleration along that axis, additional gradient is applied, and additional phase encode gradients 124 and 126 are applied to primary phase encode and secondary phase encode gradients respectively. The equations of equation 3 are then solved simultaneously as in the case of detecting material moving with constant velocity only, with the exception that now three equations must be solved simultaneously.

Higher order motion compensation is possible on any combination of the three axes by adding additional subsequent gradients. This requires solving simultaneously a larger number of the equations of Equation 3. For example, constant acceleration material could be rephased by solving simultaneously the first three equations of Equation 3, pulsatile material could be rephased by solving simultaneously the first four equations of Equation 3, and so on.

What is claimed is:

1. A magnetic resonance image generating sequence comprising:
    applying a slice select gradient, a read gradient and a phase encode gradient;
    applying a plurality of motion detection gradients in at least one of the directions of the slice select gradient, read gradient and phase encode gradient, the amplitude and duration of said motion detection gradients being selected so that the sum of any moment greater than the zeroth moment in time of the phase of the gradients in said direction is equal to zero while the sum of the zeroth moment in time of the phase of the gradients in said direction is equal to a preselected non-zero value.

2. The method of claim 1, wherein said motion detection gradients are applied in all three of the slice select, read and phase encode gradient directions.

3. A magnetic resonance imaging sequence for imaging a volume of slabs, comprising:
    applying a slab select gradient, a read gradient and a primary phase encode gradient, said slab select gradient including a secondary phase encode gradient to encode each slice within the said slab;
    applying a plurality of motion detection gradients in at least one of the directions of the slab select gradient, the read gradient and phase encode gradient, the amplitude and duration of said motion detection gradients being selected so that the sum of any moment greater than the zeroth moment in time of the phase of the gradients in said direction is equal to zero while the sum of the zeroth moment in time of the phase of the gradients in said direction is equal to a preselected non-zero value.

4. The method of claim 3, wherein said motion detection gradients are applied in all three of the slab select, read and primary phase encode gradient directions.

* * * * *